US012777639B2

(12) United States Patent
Kim et al.

(10) Patent No.: US 12,777,639 B2
(45) Date of Patent: Oct. 27, 2026

(54) SINGLE POLY NON-VOLATILE MEMORY DEVICE AND MANUFACTURING METHOD THEREOF

(71) Applicant: SK keyfoundry Inc., Cheongju-si (KR)

(72) Inventors: Su Jin Kim, Cheongju-si (KR); Min Kuck Cho, Cheongju-si (KR); Jung Hwan Lee, Cheongju-si (KR); In Chul Jung, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 434 days.

(21) Appl. No.: 18/487,546

(22) Filed: Oct. 16, 2023

(65) Prior Publication Data

US 2024/0049463 A1 Feb. 8, 2024

Related U.S. Application Data

(62) Division of application No. 17/564,367, filed on Dec. 29, 2021, now Pat. No. 11,825,650.

(30) Foreign Application Priority Data

Aug. 19, 2021 (KR) ........................ 10-2021-0109342

(51) Int. Cl.
*H10B 41/35* (2023.01)
*H10D 30/01* (2025.01)
*H10D 30/68* (2025.01)

(52) U.S. Cl.
CPC ......... *H10B 41/35* (2023.02); *H10D 30/0411* (2025.01); *H10D 30/683* (2025.01)

(58) Field of Classification Search
None
See application file for complete search history.

(56) References Cited

U.S. PATENT DOCUMENTS

| | | | | |
|---|---|---|---|---|
| 10,236,297 B2 | 3/2019 | Kim et al. | | |
| 2014/0073126 A1* | 3/2014 | Shen | H10B 43/40 | 257/E21.209 |
| 2015/0221663 A1* | 8/2015 | Tan | H10D 30/6892 | 257/300 |
| 2019/0244968 A1* | 8/2019 | Abe | H10B 43/30 | |

FOREIGN PATENT DOCUMENTS

| | | |
|---|---|---|
| JP | 2010-129979 A | 6/2010 |
| KR | 10-2005-0035944 A | 4/2005 |
| KR | 10-0952578 B1 | 4/2010 |
| KR | 10-2017-0086178 A | 7/2017 |

OTHER PUBLICATIONS

Korean Office Action issued on Jul. 19, 2022, in counterpart Korean Patent Application No. 10-2021-0109342 (9 pages in Korean).

* cited by examiner

*Primary Examiner* — Xiaoming Liu
(74) *Attorney, Agent, or Firm* — NSIP Law

(57) ABSTRACT

A single poly non-volatile memory device is provided. The single poly non-volatile memory device is formed in a semiconductor substrate, and includes a sensing transistor, a selection transistor, and a capacitor, wherein a thickness of a selection gate insulating film is formed to be thicker than a thickness of a sensing gate insulating film, wherein a thickness of a control gate insulating film of the capacitor is formed to be the same, or greater than, a thickness of the sensing gate insulating film, and wherein the sensing gate of the sensing transistor and the control gate of the capacitor are physically and electrically connected to each other.

14 Claims, 13 Drawing Sheets

SINGLE POLY NON-VOLATILE MEMORY DEVICE AND MANUFACTURING METHOD THEREOF

CROSS-REFERENCE TO RELATED APPLICATION(S)

This application is a division of application Ser. No. 17/564,367 filed on Dec. 29, 2021, which claims the benefit under 35 U.S.C. § 119 of Korean Patent Application No. 10-2021-0109342 filed on Aug. 19, 2021, in the Korean Intellectual Property Office, the entire disclosure of which is incorporated herein by reference for all purposes.

BACKGROUND

1. Field

The following disclosure relates to a single poly non-volatile memory device and manufacturing method thereof.

2. Description of Related Art

A non-volatile memory (NVM) device may be implemented in various applications such as, but not limited to, a controller Integrated Circuit (IC), Microcontroller Units (MCU), Radio Frequency Identification (RFID) Tag etc. that requires a data storage and operations to write and erase data electrically in a low power. The non-volatile memory (NVM) may be implemented in many semiconductor devices, not only for trimming to improve a yield and correct a circuit feature, but also for data storage.

By implementing a complementary metal-oxide-semiconductor (CMOS) process, an NVM device, a low voltage (LV) device, a middle voltage (MV) device, and high voltage (HV) device are formed in a chip. A thickness of a gate insulating film used in each LV, MV, and HV device may be different. There may be various gate insulating films in an NVM device such as a sensing gate insulating film, a selection gate insulating film, a control gate insulating film, etc. At least 4 to 7, or more gate insulating films may be implemented in a chip, with different thicknesses. A process to form a plurality of gate insulating films may be very difficult, and manufacturing costs may be considerably increased, which may cause problems.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a single poly non-volatile memory device includes a sensing transistor, a selection transistor, and a capacitor structure; wherein the sensing transistor includes a first P-type well region; a sensing gate insulating film formed on the first P-type well region; a sensing gate formed on the sensing gate insulating film; a drain region formed in the first P-type well region; a first contact plug formed on the drain region; and a bit line connected to the first contact plug, wherein the selection transistor includes: the first P-type well region; a selection gate insulating film formed on the first P-type well region; a selection gate formed on the selection gate insulating film; a source region formed in the first P-type well region; a second contact plug formed on the source region; and a source line connected to the second contact plug, wherein a thickness of the selection gate insulating film is formed to be thicker than a thickness of the sensing gate insulating film, wherein the capacitor structure includes a second P-type well region formed separate from the first P-type well region; a control gate insulating film formed on the second P-type well region; a control gate formed on the control gate insulating film; a third contact plug formed on the second P-type well region; and a control gate line connected to the third contact plug, wherein a thickness of the control gate insulating film is formed to be equal to a thickness of the sensing gate insulating film, or to be thicker than a thickness of the sensing gate insulating film.

The single poly non-volatile memory device may be formed in a semiconductor substrate.

The sensing gate and the control gate may be physically and electrically connected to each other.

The single poly non-volatile memory device may further include a trench region formed between the first P-type well region and the second P-type well region; an N-type well region formed under the trench region; and a deep well region formed to surround the first P-type well region, the second P-type well region, and the N-type well region.

The single poly non-volatile memory device may further include a selection gate line connected to the selection gate, wherein the source line and the bit line are configured to be parallel to each other in a plan view, wherein the control gate line and the selection gate line are configured to be parallel to each other, and wherein the source line and the bit line are configured to intersect with the control gate line and the selection gate line.

In a general aspect, a single poly non-volatile memory device manufacturing method includes forming a device isolation film in a substrate; forming a deep well region that is deeper than the device isolation film; forming a first P-type well region and a second P-type well region in the deep well region; forming a nitrogen ion implantation region inside the first P-type well region by performing an ion implantation process to a portion of the first P-type well region; forming a sensing gate insulating film by performing an oxidation process on the first P-type well region where the nitrogen ion implantation region is formed; forming a selection gate insulating film on the first P-type well region; forming a control gate insulating film on the second P-type well region; depositing a conductive film on the sensing gate insulating film, the selection gate insulating film, and the control gate insulating film; forming a sensing gate, a selection gate, and a control gate respectively on the sensing gate insulating film, the selection gate insulating film, and the control gate insulating film by patterning the conductive film; forming a drain region at a first side of the sensing gate; forming a source region at a second side of the sensing gate; forming a pick-up region at a first side of the control gate; forming a first contact plug, a second contact plug, and a third contact plug respectively on the drain region, the source region, and the pick-up region; and forming a bit line, a source line, and a control gate line respectively on the first contact plug, the second contact plug, and the third contact plug.

A thickness of the selection gate insulating film may be formed to be thicker than a thickness of the sensing gate insulating film, and a thickness of the control gate insulating film may be formed to be equal to a thickness of the sensing gate insulating film, or to be thicker than a thickness of the sensing gate insulating film.

The sensing gate and the control gate may be configured to be connected to each other physically and electrically.

A thickness of the sensing gate insulating film may be formed to be 7 nm-9 nm, and a thickness of the selection gate insulating film and the control gate insulating film are formed to be 10 nm-20 nm.

The method may further include forming the nitrogen ion implantation region in the second P-type well region.

The method may further include forming a control gate ion implantation region in the second P-type well region before forming the nitrogen ion implantation region, wherein the control gate ion implantation film may be formed by using boron or indium.

In a general aspect, a single poly non-volatile memory device includes a semiconductor substrate; a deep well region formed in the semiconductor substrate; a first P-type well region formed in the deep well region; a second P-type well region formed in the deep well region; a sensing transistor formed in the first P-type well region; a sensing gate insulating film formed on the first P-type well region; a selection transistor formed in the first P-type well region; a selection gate insulating film formed on the first P-type well region; a capacitor structure formed in the second P-type well region; and a control gate insulating film formed on the second P-type well region, wherein a thickness of the sensing gate insulating film is thinner than a thickness of the selection gate insulating film, and wherein the thickness of the sensing gate insulating film is equal to or less than a thickness of the control gate insulating film.

The sensing transistor may include a sensing gate formed on the sensing gate insulating film; and the selection transistor includes a selection gate formed on the selection gate insulating film, and the capacitor structure includes a control gate formed on the control gate insulating film.

The sensing gate of the sensing transistor and the control gate of the capacitor structure may be physically and electrically connected to each other.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
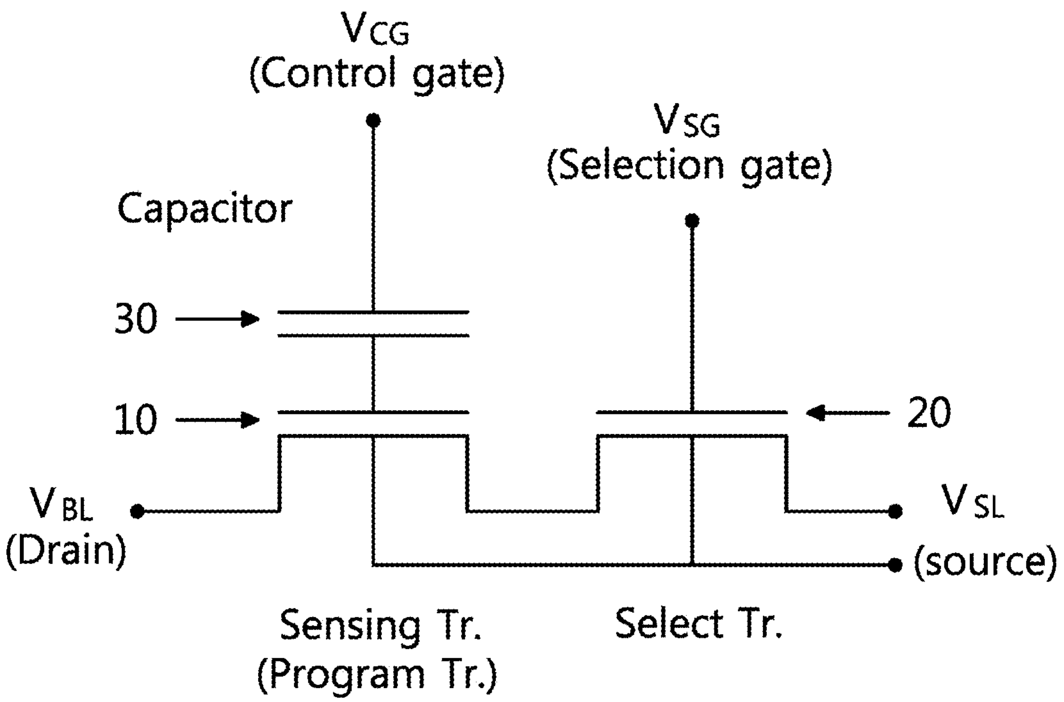
FIG. 1 illustrates an example circuit diagram of an example single poly non-volatile device, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In a general aspect, the examples relate to a manufacturing method of a single poly non-volatile memory device. to the examples may form a sensing gate insulating film, a selection gate insulating film, and a control gate insulating film having various thickness in an NVM device by using a nitrogen ion implantation process, with a low cost.

A detailed description is given below for a single poly non-volatile memory device and a manufacturing method using the same, and refers to various embodiments and drawings. However, the examples are not limited by the disclosed embodiments and drawings.

FIG. 1 illustrates an example circuit diagram of an example single poly non-volatile device, in accordance with one or more embodiments.

Referring to FIG. 1, an example memory cell is illustrated. The example memory cell may include two transistors 10 and 20, and a capacitor structure 30. In a non-limiting example, the two transistors may respectively refer to a sensing transistor 10 and a selection transistor 20.

A programming operation may be possible by charging or discharging a charge through the sensing transistor 10. The sensing transistor 10 may be referred to as a program transistor. A bit line (BL) voltage ($V_{BL}$) may be applied to a drain terminal of the sensing transistor 10.

The selection transistor 20 may select or unselect the cell. Additionally, a read function may be implemented to determine whether electron or hole carriers are charged or discharged in the sensing transistor 10. A selection gate voltage ($V_{SG}$) and a source voltage ($V_{SL}$) may be applied respectively to a gate terminal and a source terminal of the selection transistor 20. A selection gate of the selection transistor 20 may be turned on or turned off through a selection gate voltage ($V_{SG}$) applied to a selection gate electrode. In an example, the sensing transistor 10 and the selection transistor 20 may be formed in a first well region. The selection transistor 20 may prevent a leakage current from flowing in an over erase state.

A capacitor 30 may have a capacitor structure to control charging or discharging of electron carriers in a sensing gate of the sensing transistor 10. A control gate voltage ($V_{CG}$) may be applied to the capacitor structure 30. In an example, the capacitor structure 30 may be formed in a second well region.

The sensing transistor 10 may be tunneled according to a voltage difference between the control gate voltage ($V_{CG}$) and the source voltage ($V_{SL}$). Table 1 illustrates an applied voltage based on each node. $V_{PP}$ is a program/erase operation voltage, $V_{DD}$ is a power voltage, 0 is a ground voltage, $V_{READ}$ is a read voltage, $V_{BL}$ is a bit line (BL0) voltage, and $V_{DNW}$ is a voltage at a DNW 107 (see FIG. 4).

TABLE 1

| Node | $V_{SG}$ | $V_{CG}$ | $V_{SL}$ | $V_{BL}$ | $V_{DNW}$ |
|---|---|---|---|---|---|
| Program | 0 | $+V_{PP}$ | $-V_{PP}$ | Floating | $+V_{PP}$ |
| Erase | 0 | $-V_{PP}$ | $V_{PP}$ | Floating | $+V_{PP}$ |
| Read | $V_{DD}$ | $V_{READ}$ | 0 | $V_{BL}$ | $V_{DD}$ |

When a potential difference between the control gate voltage ($V_{CG}$) and the source voltage ($V_{SL}$) is positive (+), the non-volatile memory cell may charge electrons to the sensing gate of the sensing transistor 10 and program the sensing gate of the sensing transistor 10 to perform a program operation. When a potential difference between the control gate voltage ($V_{CG}$) and the source voltage ($V_{SL}$) is negative (−), the non-volatile memory cell may discharge electrons of the sensing gate of the sensing transistor 10 to perform an erase operation.

In one or more embodiments, a programming voltage ($+V_{PP}$, $-V_{PP}$) or ⅓ of the programming voltage ($+V_{PP}/3$, $-V_{PP}/3$) may be applied to a control gate voltage ($V_{CG}$), a selection gate voltage ($V_{SG}$), a source voltage ($V_{SL}$), and a drain voltage ($V_{BL}$).

Figure 2:
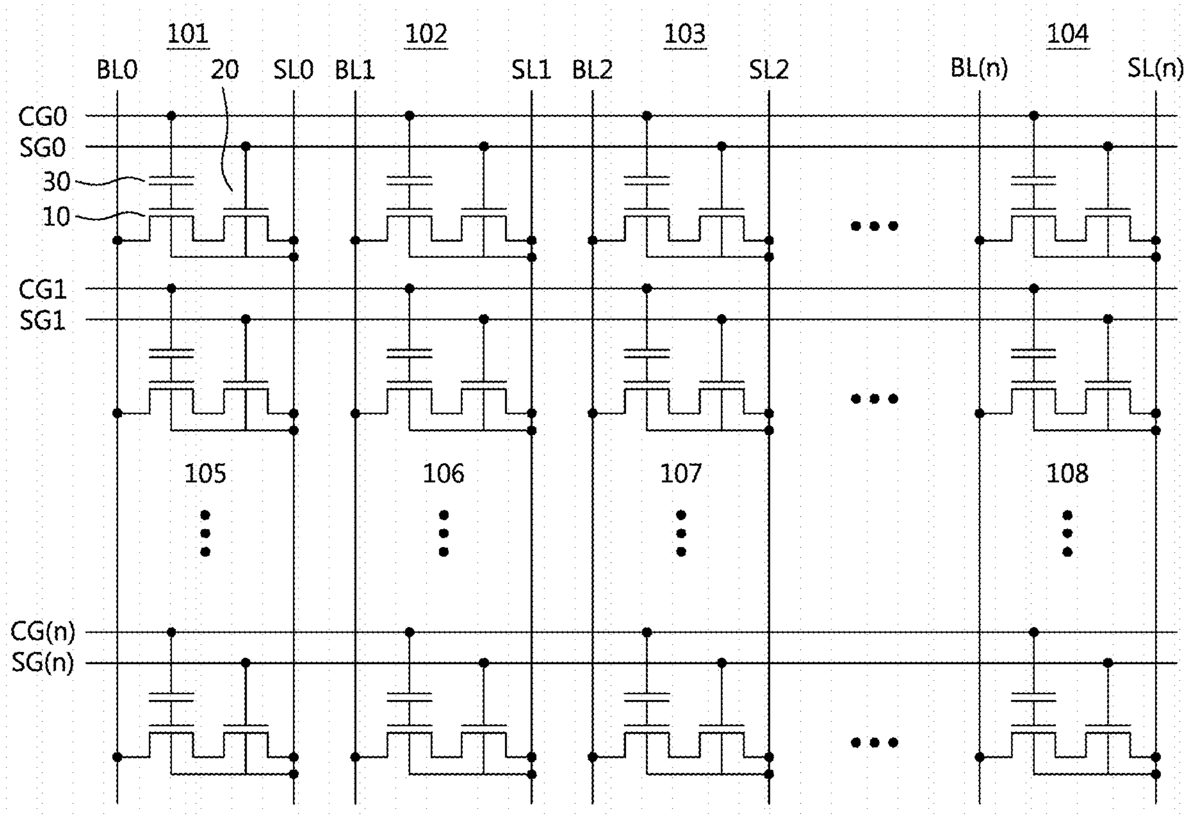
FIG. 2 illustrates an example array of an example non-volatile memory cell, in accordance with one or more embodiments.

FIG. 2 illustrates an array of a non-volatile memory cell, in accordance with one or more embodiments.

Referring to FIG. 2, as an array of a non-volatile memory cell, a plurality of memory unit cells may be included. In an example, a first unit cell 101 may include a sensing transistor 10, a selection transistor 20, and a capacitor structure 30. A second, a third, and a fourth unit cell 102-104 may also respectively include a sensing transistor 10, a selection transistor 20, and a capacitor structure 30.

An array of a non-volatile memory cells may include a first control gate line CG0 connected to the capacitor structure 30, a first selection gate line SG0 connected to a selection gate of the selection transistor 20, a first bit line BL0 connected to a drain terminal of the sensing transistor 10, and a first source line SL0 connected to a source terminal of the selection transistor 20. A selection gate line SG0 may be referred to a word line (WL). In an example, the gate of the sensing transistor 10 may be connected to the capacitor structure 30.

In a non-limiting example, the source lines SL0, SL1, SL2, SL(n) and the bit lines BL0, BL1, BL2, BL(n) may be disposed to be parallel with each other. In an example, the control gate lines CG0, CG1, CG(n) and the selection gate lines SG0, SG1, SG(n) may also be disposed to be parallel with each other. The source lines SL0, SL1, SL2, SL(n) and the bit lines BL0, BL1, BL2, BL(n) may vertically intersect with the control gate lines CG0, CG1, CG(n) and the selection gate lines SG0, SG1, SG(n).

The first to fourth unit cells 101-104 may be disposed in the first row. Each of the first to fourth unit cells 101-104 may share the first control gate line CG0 and the first selection gate line SG0. Additionally, the fifth to eighth unit cells 105-108 may be disposed in the second row. Each of the fifth to eighth unit cells 105-108 may share the second control gate line CG1 and the second selection gate line SG1.

Each of the first to fourth unit cells 101-104 may be connected to the respective bit lines BL0, BL1, BL2 and BL(n) via the respective sensing transistors 10. Additionally, each of the first to fourth unit cells 101-104 may be connected to the respective source lines SL0, SL1, SL2 and SL(n) via the respective selection transistors 20.

Each of the first unit cell 101, the second unit cell 102, the fifth unit cell 105, and the sixth unit cell 106 may be connected to the respective control gate lines CG0, CG1, CG(n) via the respective the capacitor structure 30. Additionally, each of the first unit cell 101, the second unit cell 102, the fifth unit cell 105, and the sixth unit cell 106 may be connected to the respective selection gate lines SG0, SG1, SG(n) via the respective selection transistors 10.

In one or more examples, through a control gate line CG0 and a source line SL0, a specific cell, 101, 102, 103, or 104, may be selected, a sensing transistor 10 may be operated, and electrons may be charged or discharged in a sensing transistor 10. A write and erase operation may be performed.

Additionally, for a read operation, by turning on a selection transistor 20 through a selection gate line SG0, it may be possible to distinguish whether electrons are charged or discharged in the sensing transistor 10.

Figure 3:
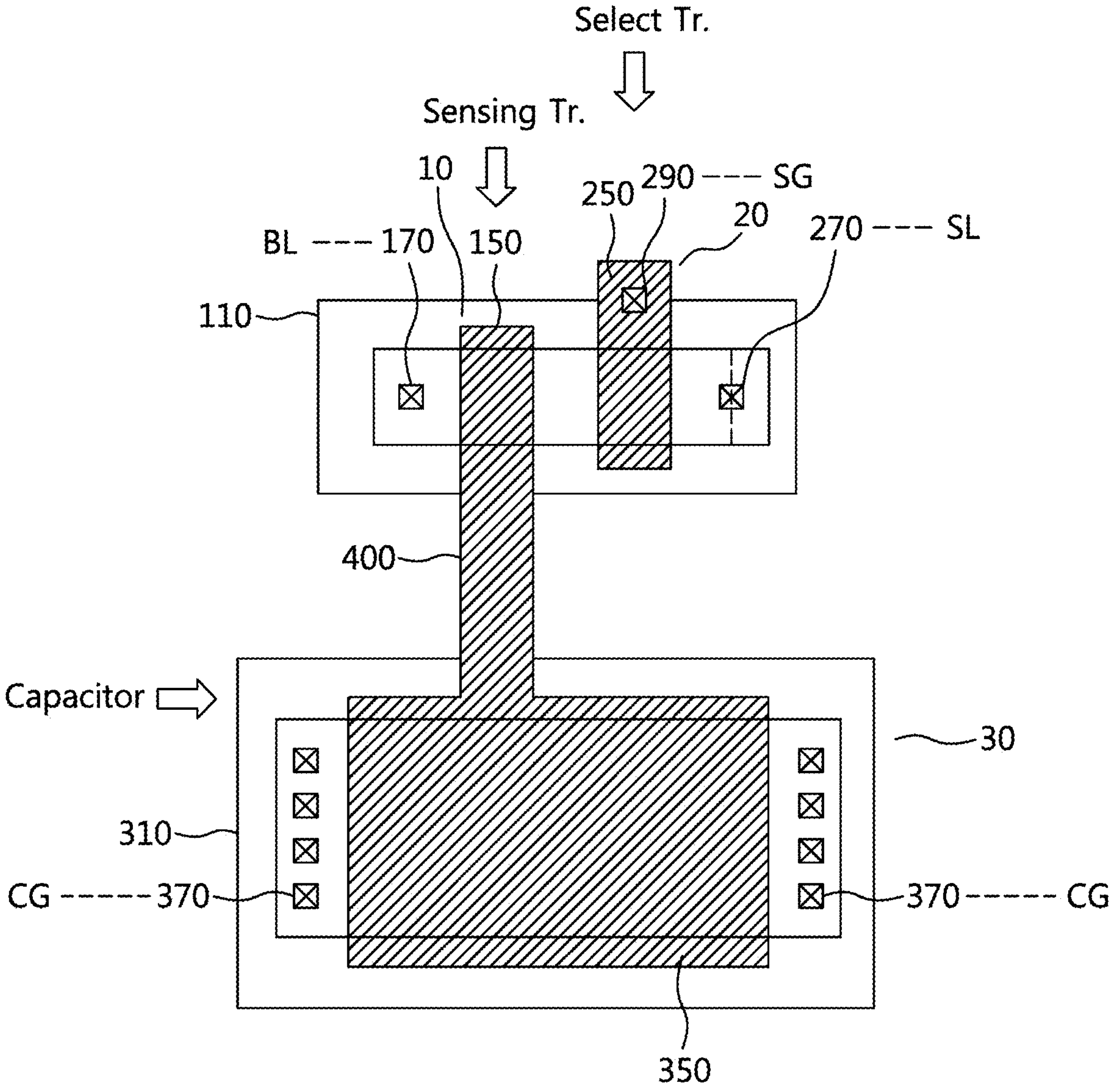
FIG. 3 illustrates an example plan view of an example single poly non-volatile memory device, in accordance with one or more embodiments.

FIG. 3 illustrates an example plan view of a single poly non-volatile memory device, in accordance with one or more embodiments.

Referring to FIG. 3, a single poly non-volatile memory device may include a sensing transistor 10, a selection transistor 20, and a P-type capacitor structure 30. The sensing transistor 10 and the selection transistor 20 may be formed in a first P-type well region (PW) 110.

The sensing transistor 10 may include a sensing gate 150 and a first contact plug 170. To apply a drain voltage ($V_{BL}$) to the first contact plug 170, a bit line (BL) may be connected to a drain contact of the sensing transistor 10. In one or more examples, the sensing gate 150 may be a portion of a floating gate (FG) 400. The floating gate 400 may also be implemented in the capacitor structure 30. In a non-limited example, a contact plug may not be connected on the floating gate (FG) 400.

In a non-limiting example, the selection transistor 20 may include a selection gate 250, a second contact plug 270, and a third contact plug 290. A source line (SL) may be connected to the second contact plug 270. To apply a voltage to the selection gate 250, a selection gate line (SG line, or, SG) may be connected to the third contact plug 290. In one or more examples, the SG line may be referred to as a word line (WL).

A P-type capacitor structure 30 may include a fourth contact plug 370 and a control gate 350 formed in a second well region 310. The fourth contact plug 370 may be formed in a second well region, and may be may be formed at opposite sides of a control gate. A control gate line (CG line, or, CG) may be connected to the fourth contact plug 370.

The control gate 350 may be considered as a portion of a floating gate (FG) 400. As a portion of the floating gate (FG) 400, the control gate 350 and the sensing gate 150 may be formed by a single poly silicon of the control gate 350, the sensing gate 150, and the floating gate (FG) 400. Electrons may be charged or discharged in the floating gate 400.

Figure 4:
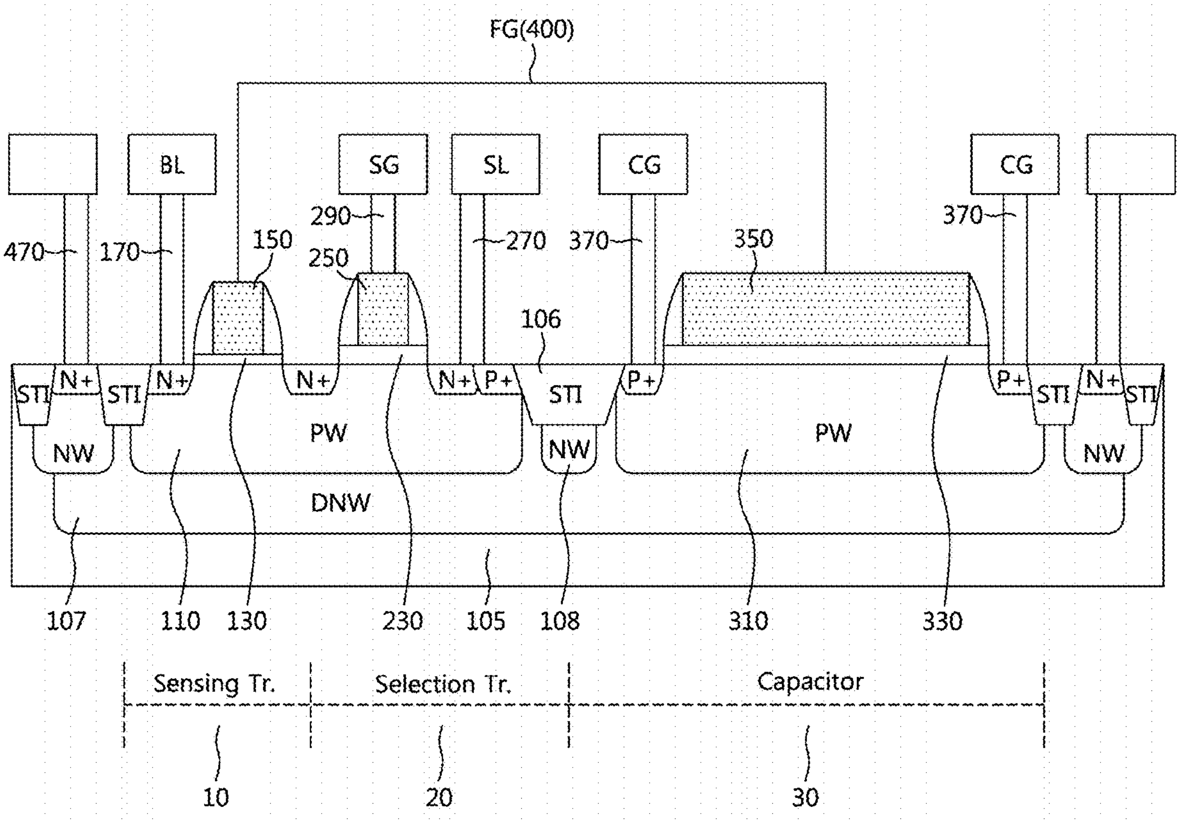
FIG. 4 illustrates an example cross-sectional view of an example single poly non-volatile memory device, in accordance with one or more embodiments.

FIG. 4 illustrates an example cross-sectional view of an example single poly non-volatile memory device, in accordance with one or more embodiments.

Referring to FIG. 4, a single poly non-volatile memory device may include a sensing transistor 10, a selection transistor 20, and a P-type capacitor structure 30.

In an example, the sensing transistor 10 and the selection transistor 20 may be formed in a first PW 110. In an example, the P-type capacitor structure 30 may be formed in a second PW 310. A sensing gate insulating film 130 and a selection gate insulating film 230 may be formed on the first PW 110. A control gate insulating film 330 may be formed on the second PW 310. In an example, the control gate insulating film 330 may be considered as a dielectric film of the capacitor structure 30. A sensing gate 150 and a selection gate 250 may be formed respectively on the sensing gate insulating film 130 and the selection gate insulating film 230. A control gate 350 may be formed on the control gate insulating film 330. In an example, the sensing gate 150 and the control gate 350 may be portions of a floating gate 400, and they may be connected to each other physically and electrically. The sensing gate 150 and the control gate 350 may be gate electrodes that comprise a poly-silicon film. The selection gate 250 may also comprise a poly-silicon film.

During execution of a program operation, a positive VPP, for example, +8V may be applied to a fourth contact plug 370, and a negative VPP, for example, −8V may be applied to a second contact plug 270. Electron carriers may then be moved from the first well region 110 to the sensing gate 150, to perform a program operation. A threshold voltage ($V_t$) of a single poly NVM 100 may be raised.

On the contrary, during execution of an erase operation, a negative VPP may be applied to the fourth contact plug 370, and a positive VPP may be applied to the second contact plug 270. Electrons in the sensing gate 150 may be discharged from the sensing gate 150 to the first well region 110, thus performing an erase operation.

In one or more examples, a thickness of the sensing gate insulating film 130 may be thinner than a thickness of the selection gate insulating film 230 and a thickness of the control gate insulating film 330. This may facilitate a smooth tunneling. Since a charge/discharge of electrons may be conducted through the sensing gate insulating film 130, it may be easy to charge/discharge carriers when the gate insulating film is thin. The electron carriers may be charged in the sensing gate 150 by a program operation, and the carriers may be discharged from the sensing gate 150 to the first well region 110 by an erase operation.

In an example, a trench region 106 may be formed between the first P-type well region 110 and the second P-type well region 310, and an N-type well region (NW) 108 may be formed under the trench region 106. The trench region 106 and the N-type well region 108 may be formed in the single poly non-volatile memory device. A deep well region (DNW) 107 may be formed to surround the first P-type well region 110, the second P-type well region 310, and the N-type well region 108.

Figure 5:
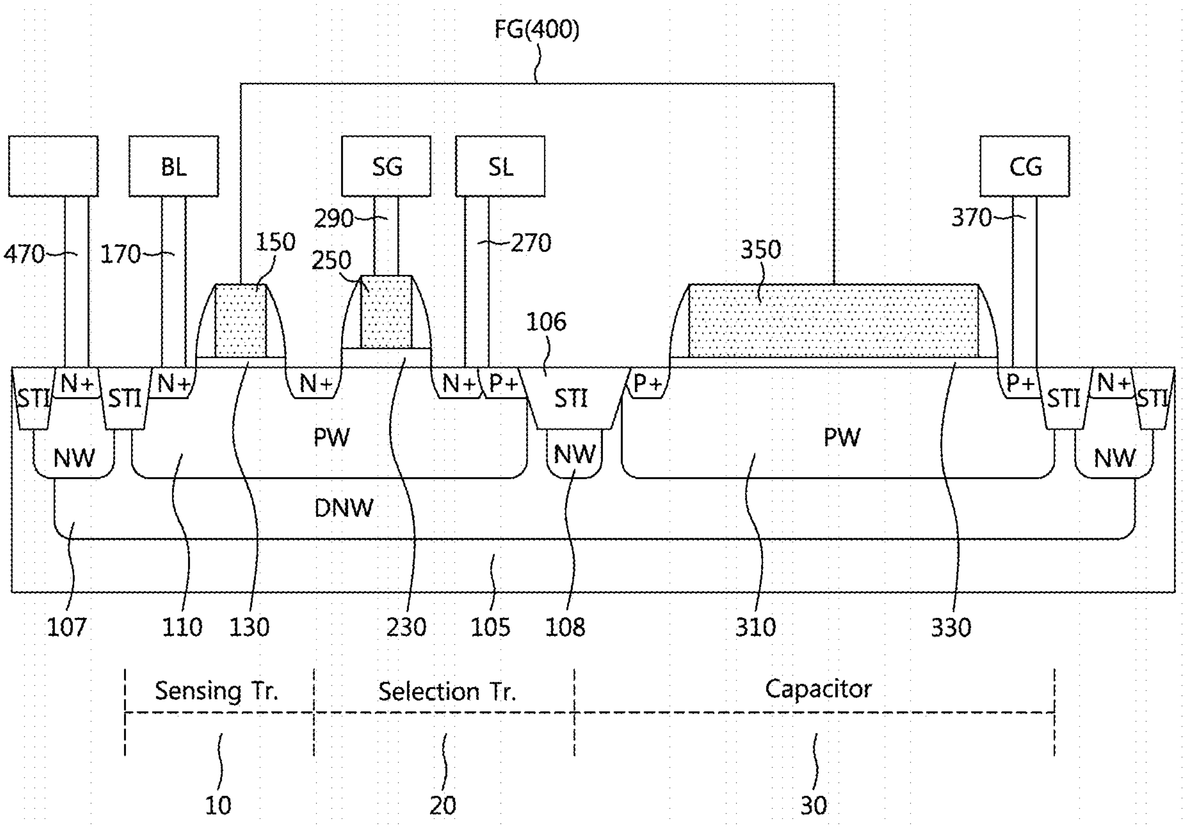
FIG. 5 illustrates an example cross-sectional view of an example single poly non-volatile memory device, in accordance with one or more embodiments.

FIG. 5 illustrates an example cross-sectional view of an example single poly non-volatile memory device in accordance with one or more embodiments.

The example structure of FIG. 5 may be similar to the example structure of FIG. 4. The difference is that a sensing gate insulating film 130 and a control gate insulating film 330 may be thinner than a selection gate insulating film 230. Specifically, a thickness of a control gate insulating film 330 may be formed to be thinner than a thickness of the selection gate insulating film 230. The formation of the control gate insulating film 330 to be thinner than the selection gate insulating film 230 may increase a coupling efficiency. In an example, in the capacitor structure 30, the control gate insulating film 330 may be considered as a dielectric film. A coupling efficiency may be increased by forming a dielectric film to be thin.

In a non-limiting example, in FIG. 4 and FIG. 5, a thickness of the control gate insulating film 330 may be formed to be identical to, or substantially identically to, a thickness of the sensing gate insulating film 130, or may be formed to be thicker than a thickness of the sensing gate insulating film 130. A thickness of a control gate insulating film 330 may be at least the same with a thickness of a sensing gate insulating film 130, or more. However, this is only an example, and a thickness of the control gate insulating film 330 may be less than a thickness of the sensing gate insulating film 130.

FIGS. 6A to 6E illustrate an example manufacturing method of a single poly non-volatile memory device, in accordance with one or more embodiments.

Figure 6A:
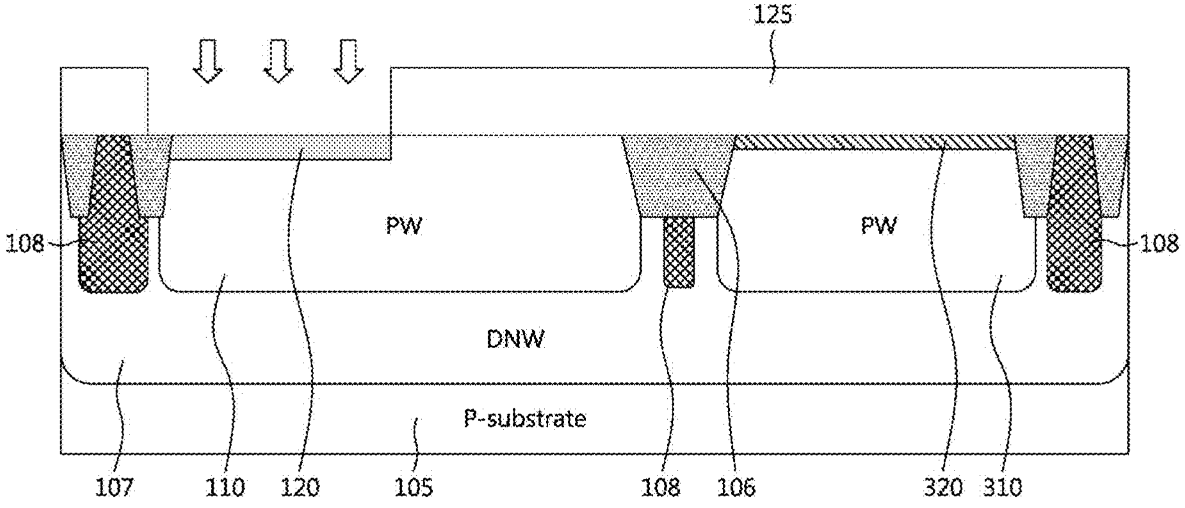
FIGS. 6A to 6E illustrate an example manufacturing method of an example single poly non-volatile memory device, in accordance with one or more embodiments.

Referring to FIG. 6A, a device isolation film 106 may be formed to define the semiconductor substrate 105 as an active region and a field region. In an example, a device isolation film may be formed using, as examples only, Shallow Trench Isolation (STI) or LOCal Oxidation of Silicon (LOCOS). It may be desirable to form a device isolation film by using STI rather than LOCOS, to embody a high integration.

A DNW 107 may be formed in the semiconductor substrate 105. An NW region 108 or a PW region 110 and 310 may be formed inside the semiconductor substrate 105 by performing a well implant process in the DNW 107. An anneal process may be performed to form the well region.

To increase a coupling ratio, a control gate ion implantation region 320 may be formed in the second PW region 310 by using boron (B) and indium (In) ion. The control gate ion implantation region 320 may be formed by implanting boron (B) and indium (In) ion consecutively. Alternately, the control gate ion implantation region 320 may be formed by implanting one of boron (B) ion or indium (In) ion. In an example, a boron ion (11B+) implantation may be performed with 10-40 KeV ion implantation energy and 1.0E11-1.0E13/cm$^2$ dose. An indium ion (115In+) implantation may be performed with 100-300 KeV and 1.0E11-1.0E13/cm$^2$ dose.

When forming a mask pattern 125 on the substrate 105, a partial region of the first PW region 110 is opened, and the rest of the region above the first PW region 110, the device isolation film 106 and the second PW region is covered. A nitrogen ion implantation region 120 may be formed inside the well by performing a nitrogen ion implantation process to an opened region, with the mask pattern 125. The nitrogen ion implantation process may be performed with 1E12-1E15 atoms/cm$^2$ and 5-30 KeV energy to form a nitrogen ion implantation region 120.

When a nitrogen ($N_2$) ion is implanted inside the first PW region 110, a speed of oxidation may be more than 3 times slower at most during a subsequent oxidation process. Accordingly, an oxide film that is thinner than other portions may be formed on a surface of an ion implanted layer.

Typically, an additional oxidation process may be desired to adjust a thickness of some oxide film, but when a manufacturing method of the non-volatile memory device of the disclosure is applied, it may be possible to adjust a thickness of an oxide film by adjusting an ion of an ion implantation process, and therefore, it may be possible to simplify a process without additionally conducting a separate oxidation process.

In one or more examples, a nitrogen ($N_2$) ion may be implanted inside the first PW region 110. A nitrogen ($N_2$) ion may be implanted in a region where the sensing gate insulating film 130 is formed.

Figure 6B:
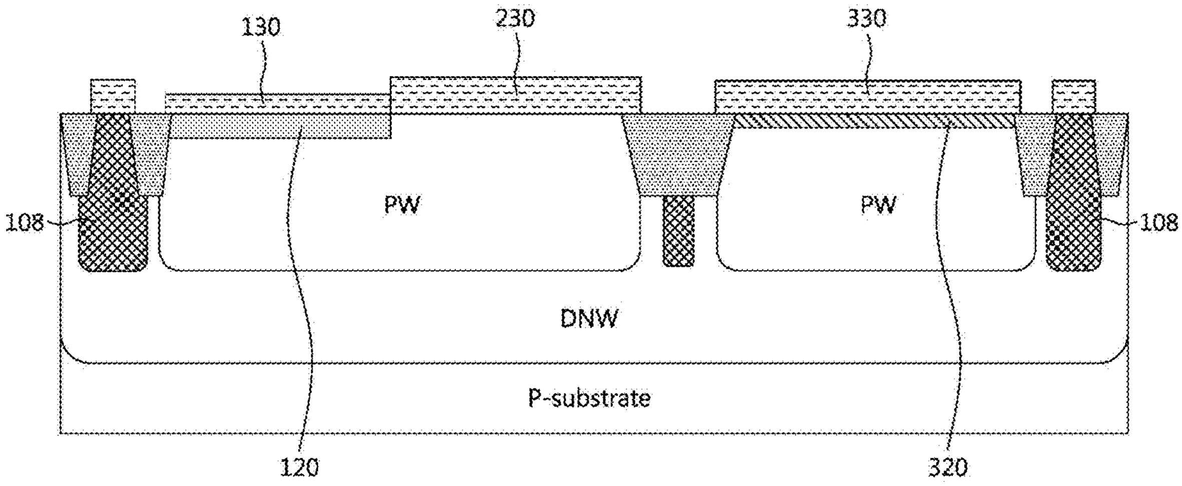

Referring to FIG. 6B, an example is illustrated when an oxidation process is performed after removing the mask pattern 125. A thickness of a sensing gate insulating film 130 may be 7-9 nm on a nitrogen ion implantation region 120 of a first PW region 110 where a nitrogen ion implantation process is performed. On the other hand, in a region where $N_2$ ion implantation process is not performed, a thickness of a selection gate insulating film 230 and a control gate insulating film 330 may be 10-20 nm. A selection gate insulating film 230 and a control gate insulating film 330 may be formed thicker than a sensing gate insulating film 130.

Figure 6C:
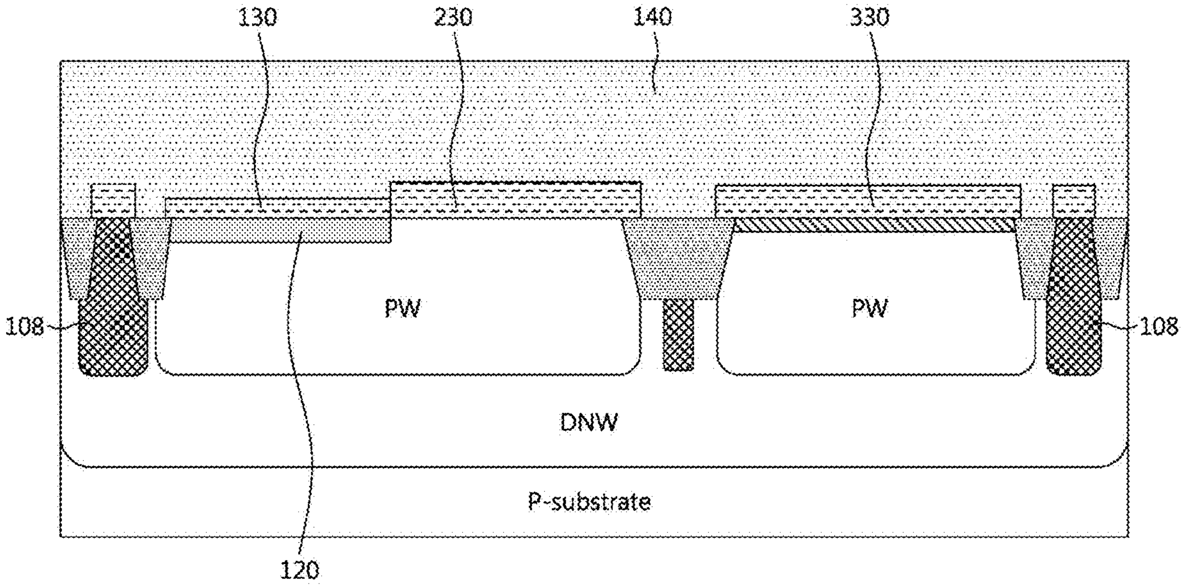

Referring to FIG. 6C, a conductive layer 140 may be formed on a top region of the entire structure with a poly-silicon layer. In an example, a poly-silicon layer may be formed by an amorphous silicon film doped by a Low Pressure Chemical Vapor Deposition (LPCVD) process, or an undoped amorphous silicon film. In an example, a doped amorphous silicon film may be formed using $SiH_4$ or $Si_2H_6$ and $PH_3$ gas. An undoped amorphous silicon film may be formed using $SiH_4$ or $Si_2H_6$ gas.

Figure 6D:
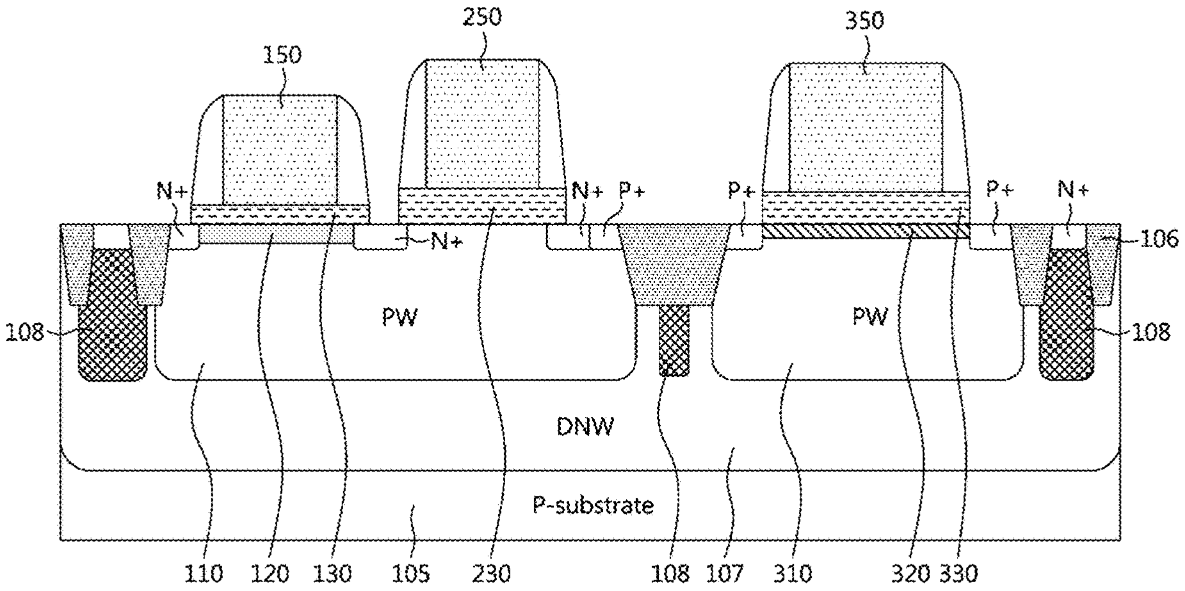

Referring to FIG. 6D, the conductive layer 140 may be patterned by performing a photo lithography process and an etching process. The sensing gate 150 and the selection gate 250 may be formed respectively on a sensing gate insulating film 130 and a selection gate insulating film 230. In an example, the selection gate insulating film 230 may be formed to have a thickness that is thicker than a thickness of the sensing gate insulating film 130. The control gate 350 may be formed on a control gate insulating film 330. The sensing gate 150 and the control gate 350 may be portions of a floating gate 400, and the sensing gate 150 and the control gate 350 may be connected to each other physically and electrically. The sensing gate 150 and the control gate 350 may be gate electrodes that comprise a poly-silicon film.

A spacer may be formed at a side of each of the sensing gate 150 and the selection gate 250, and high concentration doping regions, N+ and P+, may be formed respectively in a substrate through a high concentration ion implantation. To form an N+ region, an ion implantation may be performed by 50-70 Kev ion implantation energy and 1E15-1E16/cm$^2$ dose, with arsenic ion (75As+). By using phosphorous ion (31P+), an ion implantation may be performed by 30-50 KeV ion implantation energy and 1E12-1E14/cm$^2$ dose.

To form a P+ region, an ion implantation may be performed by 20-50 KeV ion implantation energy and 1E15-1E16/cm$^2$ dose, by using boron fluoride ion (49BF2). In using boron ion (11B+), an ion implantation may be performed by 20-40 KeV ion implantation energy and 1E12-1E14/cm$^2$ dose.

Since N+ and P+ ion implantation energy may be greater than N2 ion implantation energy as described earlier, the N+ and P+ ion implantation regions may be deeper than N2 ion implantation region 120. N2 ion implantation region 120 may be shallower than N+ and P+ regions.

An N+ region formed in a first P-type well region 110, and formed at one side of the sensing gate 150 may be a drain region (Drain). An N+ region, also formed in the first P-type well region 110, and formed at a second side of the sensing gate 150 and a first side of the selection gate 250, may be a source/drain region. An N+ region formed at a second side of the selection gate 250, may be a source region (Source). A P+ region, formed adjacent to the source region, may be a pick-up region of the first P-type well region 110.

A P+ region formed in the second PW region 310, and formed on opposite sides of the control gate 350, may be referred to as a pick-up region of the second P-type well region 310. In an example, the second PW region 310 and the P+ region formed in the second PW region 310, may be formed of a same conductive type.

Figure 6E:
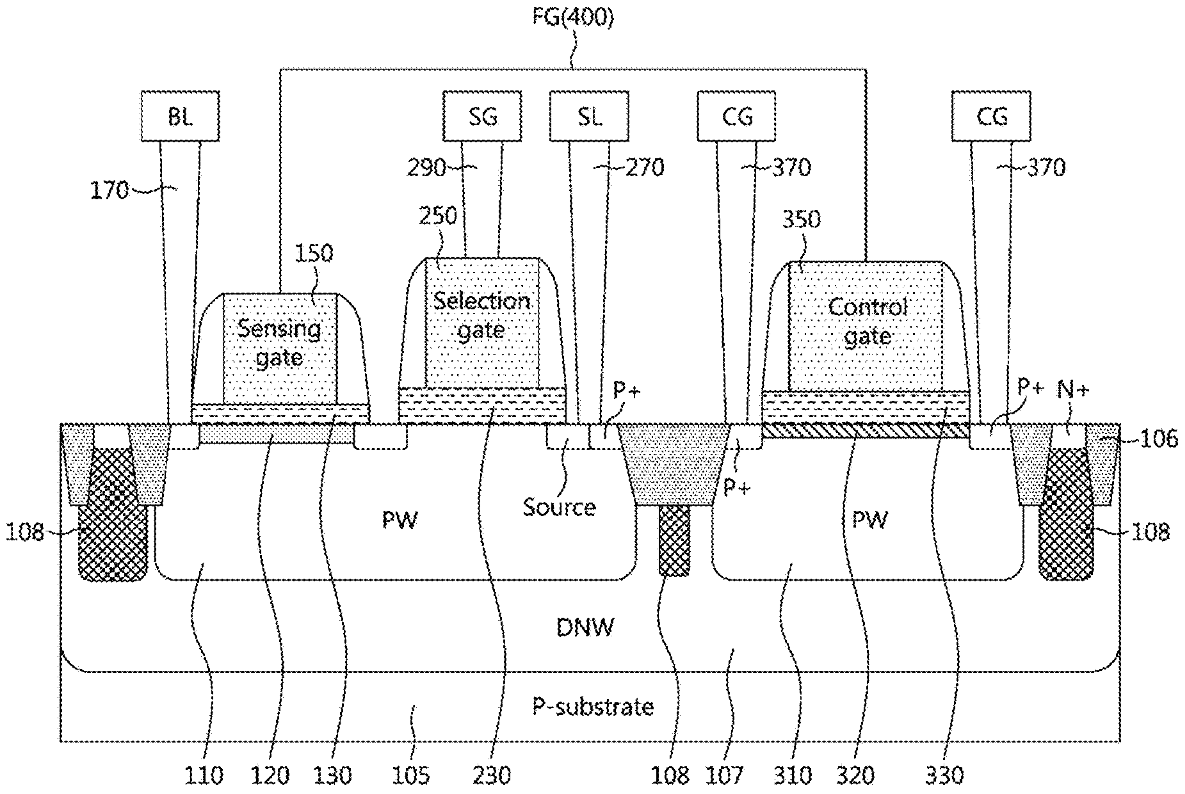

Referring to FIG. 6E, contact plugs 170, 270, 290, and 370 may be formed to respectively connect to an N+ region or a P+ region. A bit line (BL), a source line (SL), a selection gate line (SG), and a control gate line (CG) may be formed to respectively connect to the contact plugs 170, 270, 290, and 370. The bit line (BL) may be electrically connected to a drain region (Drain) through the first contact plug 170. The source line (SL) may be electrically connected to a source region (Source) through the second contact plug 270. The selection gate line (SG) may be electrically connected to the selection gate through the third contact plug 290. The first control gate line (CG) may be connected to the pick-up region (P+) through the fourth contact plug 370.

Figure 7A:
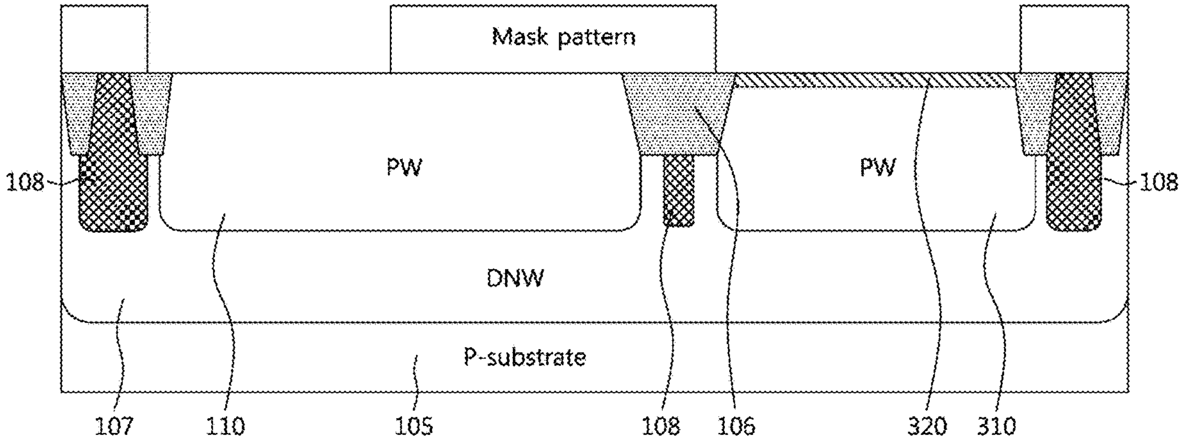
FIGS. 7A to 7C illustrate an example manufacturing method of an example single poly non-volatile memory device in accordance with one or more embodiments.
Figure 7B:
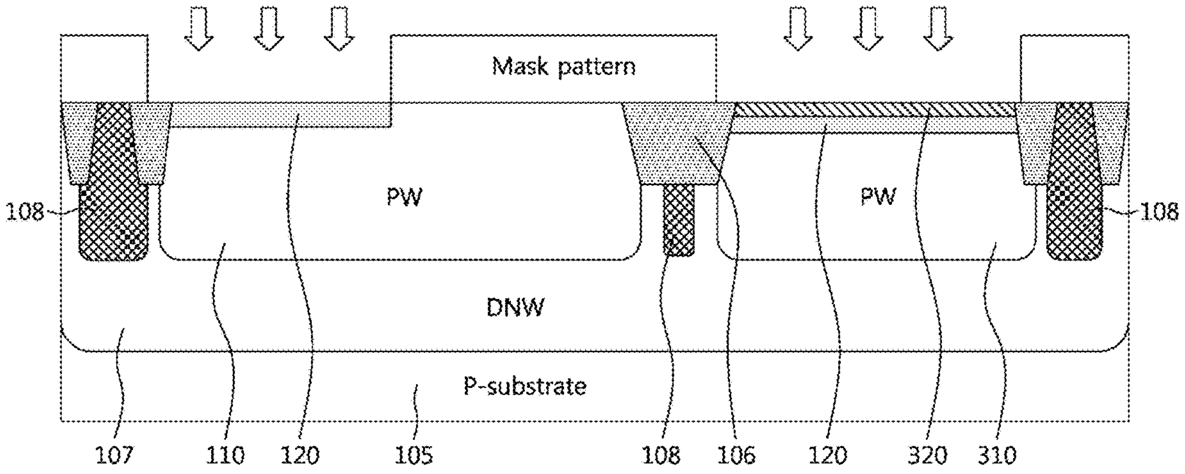
Figure 7C:
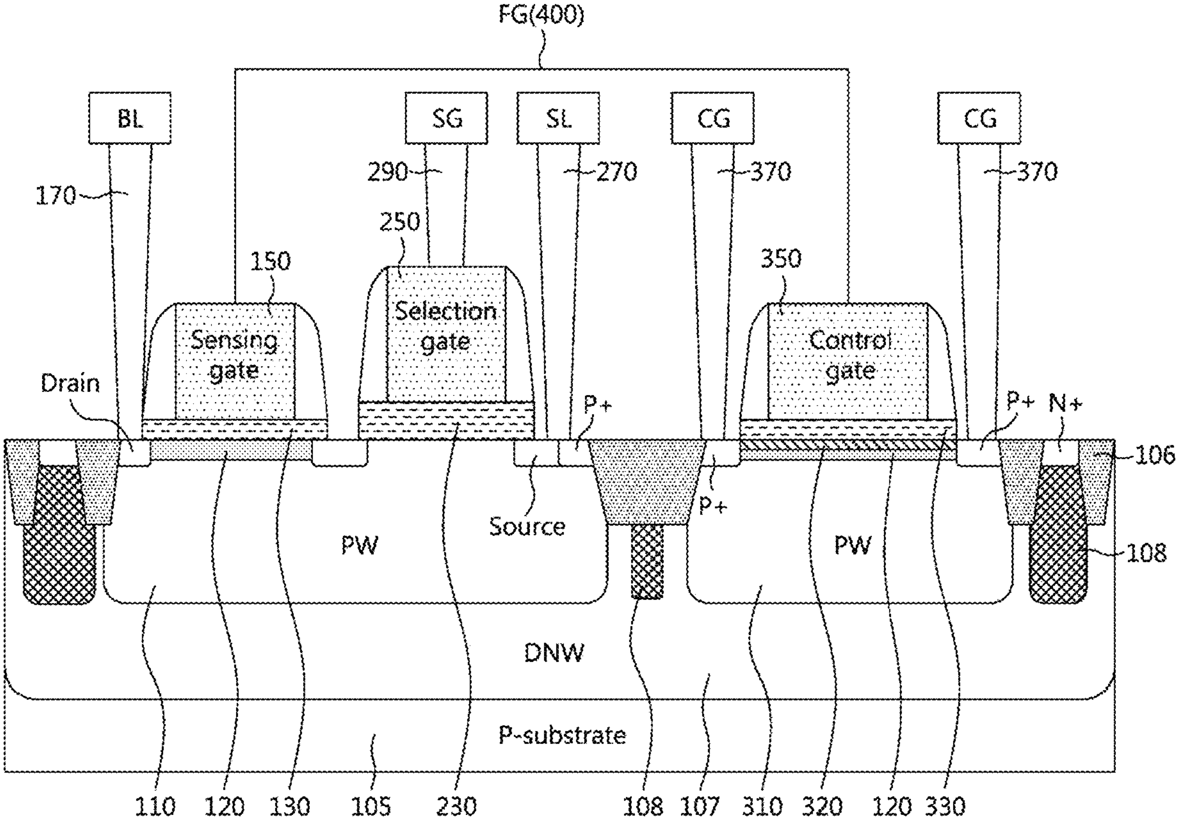

FIGS. 7A to 7C illustrate an example manufacturing method of a single poly non-volatile memory device, in accordance with one or more embodiments.

Referring to FIG. 7A, a control gate ion implantation region 320 may be formed by using boron (B) ion and indium (IN) ion in a second PW region 310 to increase a coupling ratio. Thus, the control gate ion implantation region 320 has a same conductivity type as the second PW region 310. A control gate ion implantation region 320 may be formed by consecutively implanting boron (B) ion and indium (In) ion. Alternately, the control gate ion implantation region 320 may be formed by implanting one of boron (B) ion or indium (In) ion. A boron ion (11B+) implantation may be performed with 10-40 KeV ion implantation energy and 1.0E11-1.0E13/$cm^2$ dose. An indium ion (115In+) implantation may be performed with 100-300 KeV and 1.0E11-1.0E13/$cm^2$ dose.

Referring to FIG. 7B, a nitrogen ion implantation region 120 may be formed in a partial region of a first PW 110 and a second PW 310. The nitrogen ion implantation region 120 may be implemented to form the control gate insulating film 330 in a thin thickness on the second PW 310. Accordingly, in an example, the sensing gate insulating film 130 and a control gate insulating film 330 may have a similar thickness. A thickness of the control gate insulating film 330 may be slightly increased by the control gate ion implantation region 320 of a boron implantation etc. in the second PW region 310. Accordingly, a thickness of the control gate insulating film 330 may be at least identical to a thickness of a sensing gate insulating film 130, or a thickness of the control gate insulating film 330 may be thicker than a thickness of a sensing gate insulating film 130.

In the second PW region 310, the nitrogen ion implantation region 120 and the control gate ion implantation region 320 may be formed to be overlapped with each other. The nitrogen ion implantation region 120 and the control gate ion implantation region 320 may have a similar depth.

Referring to FIG. 7C, the sensing gate insulating film 130 and the control gate insulating film 330 may have a similar thickness. However, since there is no nitrogen ion implantation region 120 in the selection gate insulating film 230, a thickness of an oxide film may be normally grown. The selection gate insulating film 230 may be formed to be thicker than the sensing gate insulating film 130 and the control gate insulating film 330.

The disclosure has discussed various examples. However, a specific embodiment does not have to include all of the examples or may only include some examples. A technical scope of the disclosure should not be understood to be limited by those effects.

According to the summary of the disclosure, a manufacturing method of a single poly non-volatile memory device may adjust a thickness of an oxide film by adjusting ion of an ion implantation process without additionally conducting a separate oxidation process, and therefore, it is possible to simplify a process. It may solve typical problems that an additional oxidation process is needed to adjust a thickness of some oxidation film of a device.

By implementing a program region and an erase region separately, a single poly non-volatile memory device using a manufacturing method of the disclosure may improve a durability of a device and a retention ability of data through improving a degradation of an oxide caused by a cycling of a device.

Additionally, a single poly non-volatile memory device may improve an efficiency of a write and erase operation and reduce an area of a memory device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a single poly non-volatile memory device, the method comprising:

forming an insulated isolation region in a substrate;

forming a first well region and a second well region in the substrate;

forming a mask pattern exposing a first portion of the first well region, and covering a second portion of the first well region and the second well region;

performing a nitrogen ion implantation process on the substrate with the mask pattern to form a nitrogen region in the first portion of the first well region;

performing an oxidation process on the first portion of the first well region, the second portion of the first well region, and the second well region to simultaneously form a sensing gate insulating film, a selection gate insulating film, and a control gate insulating film, respectively; and forming a sensing gate, a selection gate, and a control gate on the sensing gate insulating film, the selection gate insulating film, and the control gate insulating film, respectively, wherein a thickness of the sensing gate insulating film is formed to be 7 nm-9 nm, and wherein a thickness of the selection gate insulating film and a thickness of the control gate insulating film are each formed to be 10 nm-20 nm.

2. The method of claim 1, further comprising forming a source region and a drain region adjacent to the sensing gate insulating film, wherein the nitrogen region is disposed between the source region and the drain region, and disposed under the sensing gate insulating film.

3. The method of claim 1, wherein the nitrogen region is disposed closer to the sensing gate insulating film than the selection gate insulating film.

4. The method of claim 1, wherein the thickness of the control gate insulating film is equal to the thickness of the selection gate insulating film.

5. The method of claim 1, wherein the sensing gate and the control gate are physically and electrically connected.

6. A method of manufacturing a single poly non-volatile memory device, the method comprising:

forming an insulated isolation region in a substrate;

forming a first well region and a second well region in the substrate;

forming a mask pattern exposing a first portion of the first well region and the second well region, and covering a second portion of the first well region;

performing a nitrogen ion implantation process on the substrate with the mask pattern to form a first nitrogen region in the first portion of the first well region, and form a second nitrogen region in the second well region;

performing an oxidation process on the first portion of the first well region, the second portion of the first well region, and the second well region to simultaneously form a sensing gate insulating film, a selection gate insulating film, and a control gate insulating film, respectively; and forming a sensing gate, a selection gate, and a control gate on the sensing gate insulating film, the selection gate insulating film, and the control gate insulating film, respectively, wherein each of a thickness of the sensing gate insulating film and a thickness of the control gate insulating film is thinner than a thickness of the selection gate insulating film.

7. The method of claim 6, wherein the first nitrogen region and the second nitrogen region are formed under the sensing gate insulating film and the control gate insulating film, respectively.

8. The method of claim 6, further comprising:

performing a control gate ion implantation process on the substrate to form a control gate ion implantation region in the second well region.

9. The method of claim 8, wherein the control gate ion implantation region is formed under the control gate insulating film, and overlaps the second nitrogen region.

10. The method of claim 8, wherein the control gate ion implantation region comprises boron or indium.

11. The method of claim 8, wherein the mask pattern extends to the insulated isolation region.

12. A method of manufacturing a single poly non-volatile memory device, the method comprising:

forming an insulated isolation region in a substrate;

forming a first well region and a second well region in the substrate;

performing a nitrogen ion implantation process on the first and second well regions to form a first nitrogen region and a second nitrogen region in the first and second well regions, respectively;

performing an oxidation process on the first well region and the second well region to simultaneously form a sensing gate insulating film and a control gate insulating film, respectively; and forming a sensing gate and a control gate on the sensing gate insulating film and the control gate insulating film, respectively, wherein the sensing gate insulating film has a same thickness as the control gate insulating film, and wherein the sensing gate and the control gate are electrically connected, wherein the performing the nitrogen ion implantation process on the first and second well regions comprises forming a mask pattern exposing the first well region and the second well region, and covering the insulated isolation region.

13. The method of claim 12, wherein the first nitrogen region and the second nitrogen region are formed under the sensing gate insulating film and the control gate insulating film, respectively.

14. The method of claim 12, further comprising:

performing a control gate ion implantation process on the substrate to form a control gate ion implantation region in the second well region, wherein the control gate ion implantation region is formed under the control gate insulating film, and overlaps the second nitrogen region.

* * * * *